(12) United States Patent
Kubo

(10) Patent No.: US 6,251,529 B1
(45) Date of Patent: Jun. 26, 2001

(54) NB-SN COMPOUND SUPERCONDUCTING WIRE PRECURSOR, METHOD FOR PRODUCING THE SAME AND METHOD FOR PRODUCING NB-SN COMPOUND SUPERCONDUCTING WIRE

(75) Inventor: Yoshio Kubo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/141,561

(22) Filed: Aug. 28, 1998

(51) Int. Cl.[7] ....................................... B32B 15/00
(52) U.S. Cl. ..................... 428/619; 428/930; 428/662; 428/660; 428/674; 505/919; 505/813; 505/814
(58) Field of Search ................................. 428/614, 930, 428/662, 660, 674; 505/919, 813, 814

(56) References Cited

U.S. PATENT DOCUMENTS 3,905,839   9/1975   Hashimoto .

FOREIGN PATENT DOCUMENTS

| | | |
|---|---|---|
| 61-50136 | 1/1986 | (JP) . |
| 648698 | 2/1989 | (JP) . |
| 350368 | 1/1991 | (JP) . |

*Primary Examiner*—Deborah Jones
*Assistant Examiner*—Jason de la Peña
(74) *Attorney, Agent, or Firm*—Leydig, Voit & Mayer, Ltd.

(57) ABSTRACT

An Nb—Sn compound superconducting wire precursor comprising a matrix of a Cu-base metal, a plurality of composite filaments each composed of a niobium layer of an Nb-base metal and a titanium layer of pure Ti formed so as to be enveloped in the inside of the niobium layer, and Sn diffused in the matrix by heat treatment so as to be combined with the niobium layer to form a compound, the plurality of composite filaments being embedded in the matrix so as not to be in contact with one another. Further, disclosed is a method for producing the precursor comprising the steps of: forming a plurality of composite filament materials each composed of a niobium material of an Nb-base metal and a titanium material of pure Ti formed so as to be enveloped in the inside of the niobium material; forming a composite rod in which the plurality of composite filament materials are arranged in a matrix of a Cu-base metal so as not to be in contact with one another, the matrix containing Sn capable of being diffused by heat treatment so as to be combined with the niobium material to form a compound; and drawing the composite rod.

12 Claims, 7 Drawing Sheets

NB-SN COMPOUND SUPERCONDUCTING WIRE PRECURSOR, METHOD FOR PRODUCING THE SAME AND METHOD FOR PRODUCING NB-SN COMPOUND SUPERCONDUCTING WIRE

BACKGROUND OF THE INVENTION

The present invention relates to a precursor for producing an $Nb_3Sn$ compound superconducting wire used for a high magnetic field superconducting magnet, a method for producing the precursor, and a method for producing an $Nb_3Sn$ compound superconducting wire.

FIG. 9 is a sectional view of a precursor for producing an $Nb_3Sn$ compound superconducting wire by a conventional internal tin diffusion method, and FIG. 10 is a sectional view of a compound superconducting wire produced from the precursor by heat treatment. For example, the precursor and the compound superconducting wire are disclosed in JP-A-57-82911.

In FIG. 9, the reference numeral 17 designates an $Nb_3Sn$ compound superconducting wire precursor before heat treatment (hereinafter referred to as "precursor"). The precursor 17 is composed of filaments 18 of a niobium(Nb)-base metal which will be made superconductive by heat treatment, a matrix 19 of a copper(Cu)-base metal for embedding the filaments 18, a barrier material 5 of tantalum (Ta) provided on the outer circumference of the matrix 19, a stabilizing material 6 of oxygen-free copper provided on the outer circumference of the barrier material 5, and a tin-base core 20 of an Sn-2% Ti alloy material embedded in the center portion of the matrix 19.

In FIG. 10, the reference numeral 21 designates an $Nb_3Sn$ compound superconducting wire after heat treatment (hereinafter referred to as "compound superconducting wire"). The compound superconducting wire 21 is composed of superconducting filaments 22 of $Nb_3Sn$ produced by heat treatment, a matrix 23 of a Cu-base metal for embedding the superconducting filaments 22, a barrier material 5 provided on the outer circumference of the matrix 23, and a stabilizing material 6 of oxygen-free copper provided on the outer circumference of the barrier material 5. The matrix 23 is provided as low-concentration Sn bronze because Sn in the tin-base core 20 is diffused at the time of heat treatment.

The precursor 17 shown in FIG. 9 is produced as follows.

First, an Nb rod is inserted in a Cu pipe and the section of the Cu pipe is reduced to a predetermined size, so that a filament material of Cu-coated Nb wire is formed. The filament material is cut into a suitable length to form a large number of filament materials. A billet of Cu is filled with the large number of filament materials. A rod of Cu is arranged or a large number of Cu wires are arranged in advance in the center portion of the billet. The billet is evacuated, sealed with a cover, and then subjected to extruding. Then, a hole is mechanically formed in the center of the billet to form a hollow portion. A tin-base core material of Sn-2% Ti alloy is inserted in the hollow portion. The outside of the billet subjected to extruding is coated with a Ta pipe and with a Cu pipe successively. Further, the section of the whole is reduced to a predetermined size. Thus, a precursor 17 shown in FIG. 9 is produced. Incidentally, in order to make the current capacity high, the section of a Cu pipe filled with a large member of such precursors 17 may be reduced.

The precursor 17 produced as described above is twisted, and then subjected to preheat treatment and final heat treatment (generally, at a temperature in a range of from 600° C. to 800° C.) to thereby obtain the compound superconducting wire 21 shown in FIG. 10.

By the final heat treatment, Sn in the tin-base core 20 of Sn-2% Ti alloy in the precursor 17 shown in FIG. 9 is diffused into the ambient matrix material 19 to change the matrix 19 into a Cu-Sn alloy and, further, Sn reacts with the filaments 18 to generate $Nb_3Sn$ in the surfaces of the filaments 18 or in all the filaments 18. Thus, the superconducting filaments 22 shown in FIG. 10 are produced.

The compound superconducting wire 21 according to the internal tin diffusion method as shown in FIG. 10 has a structure in which superconducting filaments 22 of $Nb_3Sn$ generated by heat treatment are embedded in the matrix 23 as densely as possible while being prevented from being in contact with one another in order to increase as large as possible, the critical current density (Jc) which is one of superconducting properties.

Further, in order to improve the Jc property in a high magnetic field through improvement of an upper critical magnetic field which is one of the superconducting properties, Ti is added to the superconducting filaments 22 of $Nb_3Sn$. There are various methods for adding Ti as follows.

In an internal tin diffusion method, employed are a method of adding Ti as an alloy to a tin-base core 20 as shown in FIG. 9 (JP-A-62-174354), a method of adding Ti as an alloy to filaments 18 shown in FIG. 9 (JP-A-60-170113), and a method in which both the two methods mentioned above are used in combination.

In a so-called bronze method using a precursor which is configured such that an Nb-base metal material is embedded in the matrix 19 provided as a Cu-Sn alloy, employed are a method of adding Ti as an alloy to filaments 18 (JP-A-57-54260), and a method of adding Ti as an alloy to the matrix 19 (JP-A-58-23110).

In a so-called jelly roll method using a precursor which is configured such that rolls of Nb foil used instead of the Nb rods are embedded in the matrix 19, employed is a method of adding Ti as an alloy to the Nb foil (PCT Application: PCT/US 90/054/08).

The methods of adding Ti as an alloy in the conventional internal tin diffusion method, bronze method and jerry roll method have the following problems (1) to (6) in production and use of the alloy.

(1) It is difficult to produce a Ti-added alloy because of generation of a Ti intermetallic compound or work-hardening. Accordingly, a good-quality alloy material free from breaking cannot be obtained.

(2) When any other metal such as Mn, etc. than Ti is added simultaneously with Ti, an intermetallic compound is generated to make it difficult to process a Ti-added alloy.

(3) In production (vacuum melting) of a Ti-added alloy, oxygen impurities such as Ti oxide, etc. increase because the vapor pressure of Ti is so high that the degree of vacuum at the time of vacuum melting cannot be increased. Accordingly, the superconducting property of the superconducting filaments 22 is worsened by the oxygen impurities.

(4) In production of a Ti-added Sn alloy, the size of the Ti intermetallic compound varies in accordance with the cooling speed. Accordingly, when the size of the Ti intermetallic compound is large, Jc in the superconducting filaments 22 varies.

(5) The cost for production of a Ti-added Nb alloy increases because vacuum melting is required.

(6) In the internal tin diffusion method, the tin-base core 20 of Sn—Ti is embedded in the center portion of the matrix 19. Accordingly, in preheat treatment for diffusing Sn and Ti, the concentration gradient of Ti is generated between the inner and outer arrays of filaments 18. After final heat treatment, the outer array of filaments 18 are inferior in Jc property to the inner array of filaments 18 and lower in n-value which is one of the superconducting properties (the n-value is an index for indicating uniformity in the longitudinal direction of a superconducting wire, that is, the superconducting property becomes excellent as the n-value increases).

SUMMARY OF THE INVENTION

The present invention is designed to solve the aforementioned problems and an object thereof is to provide an $Nb_3Sn$ compound superconducting wire in which Ti can be added to superconducting filaments without using an Sn—Ti alloy, a Cu—Ti alloy, a Cu—Sn—Ti alloy or an Nb—Ti alloy as a conventional Ti-added alloy to thereby attain easy production, low cost, stable quality and improvement in superconducting properties Jc and n-value, that is, to provide a compound superconducting wire precursor, a method for producing the same, and a method for producing a compound superconducting wire.

In order to achieve the above object, according to an aspect of the present invention, provided is an Nb—Sn compound superconducting wire precursor comprising a matrix of a Cu-base metal, a plurality of composite filaments each composed of a niobium layer of an Nb-base metal and a titanium layer of pure Ti formed so as to be enveloped in the inside of the niobium layer, and Sn diffused in the matrix by heat treatment so as to be combined with the niobium layer to form a compound, the plurality of composite filaments being embedded in the matrix so as not to be in contact with one another.

In the above Nb—Sn compound superconducting wire precursor, preferably, the ratio of a titanium material in each of the composite filaments is set to be in a range of from 0.01% by weight to 5.0% by weight.

In the above Nb—Sn compound superconducting wire precursor, preferably, the niobium layer contains 0.01 to 5.0% by weight of one element or more selected from the group consisting of Ta, Hf, Mo, Zr, V and W.

In the above Nb—Sn compound superconducting wire precursor, preferably, the matrix is composed of pure copper, the Sn to be combined with the niobium layer to form a compound is composed of a tin-base core of a tin-base metal, the tin-base core being embedded in the matrix of pure copper so as not to be in contact with the composite filaments.

In the above Nb—Sn compound superconducting wire precursor, preferably, each of the composite filaments is shaped like a roll so that the tin-base core is enclosed by the roll-like composite filaments.

In the above Nb—Sn compound superconducting wire precursor, preferably, the tin-base core contains 0.01 to 10% by weight of one element or more selected from the group consisting of In, Ga, Bi, Mg, Al, Ge and Si.

In the above Nb—Sn compound superconducting wire precursor, preferably, the matrix is composed of Cu—Sn bronze, and the Sn to be combined with the niobium layer to form a compound is Sn of the Cu—Sn bronze.

In the above Nb—Sn compound superconducting wire precursor, preferably, the matrix contains 0.01 to 5% by weight of one element or more selected from the group consisting of Mn, Ge, Si, Ni, Sn, Ga and Zn.

According to another aspect of the present invention, provided is a method for producing an Nb—Sn compound superconducting wire precursor, comprising the steps of: (a) forming a plurality of composite filament materials each composed of a niobium material of an Nb-base metal and a titanium material of pure Ti formed so as to be enveloped in the inside of the niobium material; (b) forming a composite rod in which the plurality of composite filament materials are arranged in a matrix of a Cu-base metal so as not to be in contact with one another, the matrix containing Sn capable of being diffused by heat treatment so as to be combined with the niobium material to form a compound; and (c) drawing the composite rod.

In the above method for producing an Nb—Sn compound superconducting wire precursor, preferably, in the step (a), the ratio of the titanium material in each of the composite filament materials is set to be in a range of from 0.01 to 5.0% by weight.

In the above method for producing an Nb—Sn compound superconducting wire precursor, preferably, in the step (a), the niobium material contains 0.01 to 5.0% by weight of one element or more selected from the group consisting of Ta, Hf, Mo, Zr, V and W.

In the above method for producing an Nb—Sn compound superconducting wire precursor, preferably, in the step (b): the matrix is composed of pure copper; the Sn to be combined with the niobium material to form a compound is composed of a tin-base core material of an Sn-base metal; and the tin-base core material is arranged in the matrix so as not to be in contact with the composite filament materials.

In the above method for producing an Nb—Sn compound superconducting wire precursor, preferably, each of the composite filament materials is shaped like a roll so that the tin-base core material of the Sn-base metal is enclosed by the composite filament materials.

In the above method for producing an Nb—Sn compound superconducting wire precursor, preferably, the tin-base core material contains 0.01 to 10% by weight of one element or more selected from the group consisting of In, Ga, Bi, Mg, Al, Ge and Si.

In the above method for producing an Nb—Sn compound superconducting wire precursor, preferably, in the step (b), the matrix is composed of Cu—Sn bronze, and the Sn to be combined with the niobium material to form a compound is Sn of the Cu—Sn bronze.

In the above method for producing an Nb—Sn compound superconducting wire precursor, preferably, the matrix contains 0.01 to 5% by weight of one element or more selected from the group consisting of Mn, Ge, Si, Ni, Sn, Ga and Zn.

According to a further aspect of the present invention, provided is a method for producing an Nb—Sn compound superconducting wire, comprising heat-treating any Nb—Sn compound superconducting wire precursor defined above to thereby form an Nb—Sn compound superconducting wire.

DESCRIPTION OF THE PREFERRED EMBODIMENTS

First, various modes for carrying out the present invention will be described below with reference to the drawings, prior to description of specific embodiments.

Figure 2:
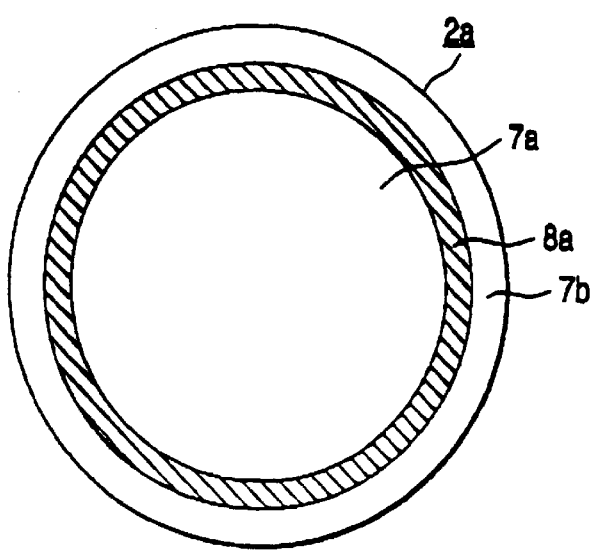
FIG. 2 is a cross-sectional view of a composite filament material used for producing the Nb—Sn compound superconducting wire precursor shown in FIG. 1.
Figure 3:
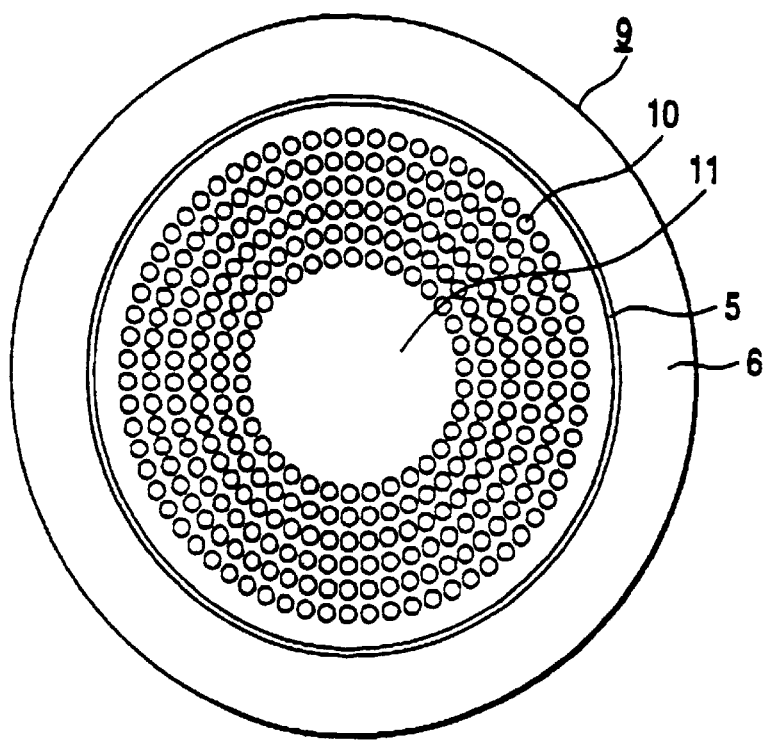
FIG. 3 is a sectional view of an Nb—Sn compound superconducting wire obtained by heating the Nb—Sn compound superconducting wire precursor shown in FIG. 1.
Figure 4:
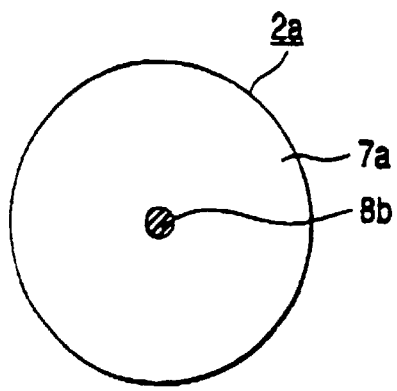
FIG. 4 is a cross-sectional view of a composite filament material used for producing an Nb—Sn compound superconducting wire precursor according to another embodiment of the present invention.
Figure 5:
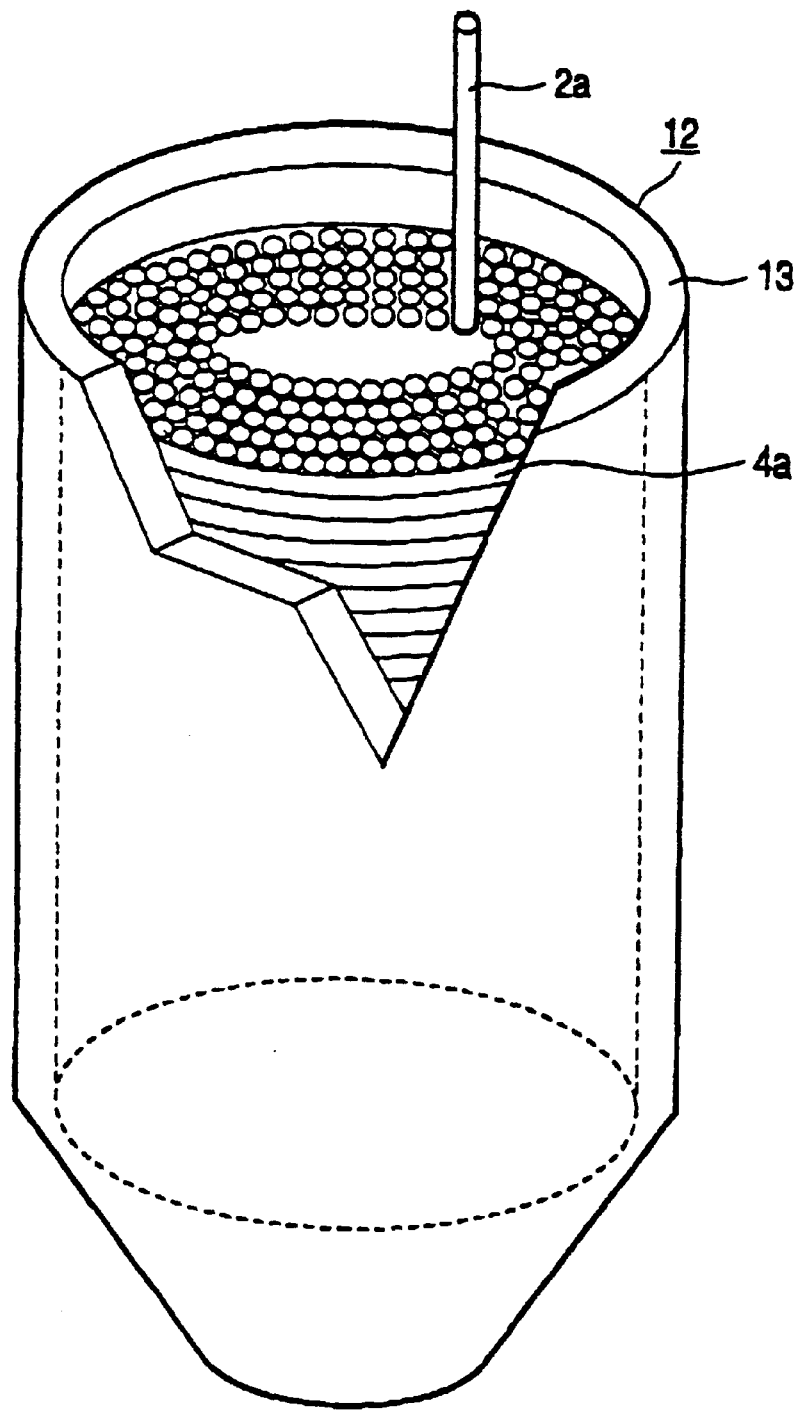
FIG. 5 is a perspective view for explaining a method of producing an Nb—Sn compound superconducting wire precursor according to the present invention.
Figure 6A:
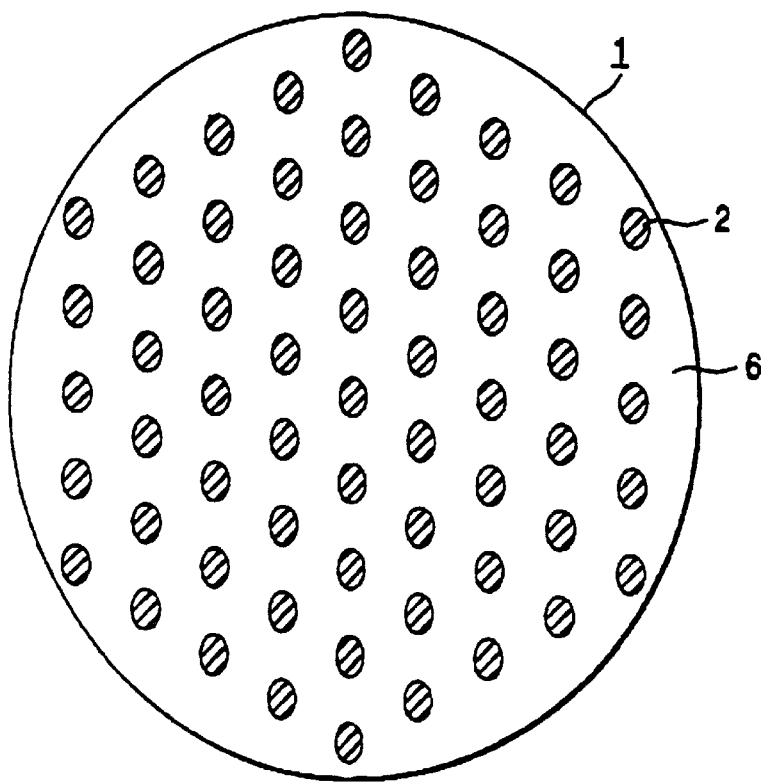
FIGS. 6A and 6B are cross-sectional views showing an Nb—Sn compound superconducting wire precursor according to a further embodiment of the present invention.
Figure 6B:
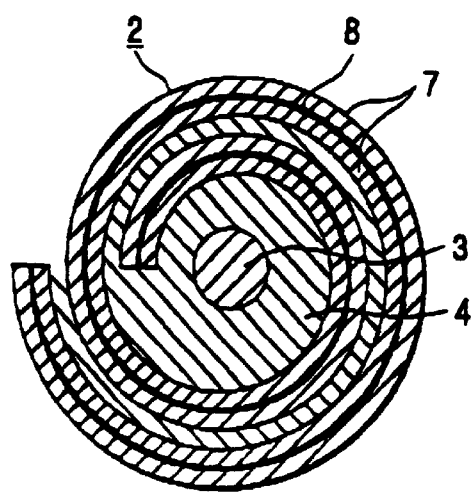
Figure 7:
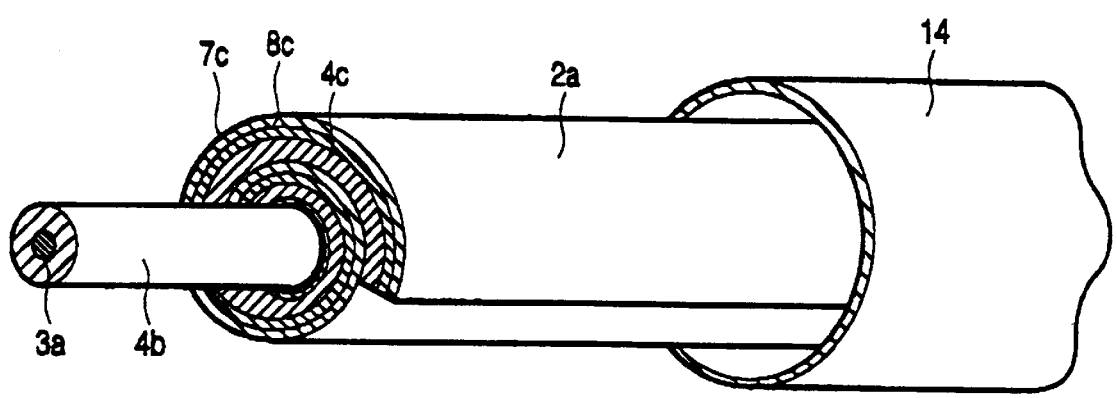
FIG. 7 is a perspective view of a composite filament material used for producing the Nb—Sn compound superconducting wire precursor shown in FIGS. 6A and 6B.

FIGS. 1, 6A, 6B and 8A are cross-sectional views for explaining the configuration of an $Nb_3Sn$ compound superconducting wire precursor (hereinafter referred to as "precursor") according to the present invention. FIG. 6B is an enlarged cross-sectional view showing one of composite filaments 2 depicted in FIG. 6A. FIG. 2 is an enlarged cross-sectional view of a composite filament material used for producing the composite filaments depicted in FIG. 1. FIG. 4 is a cross-sectional view showing another embodiment of the composite filament material. FIG. 7 is an enlarged perspective view of a composite filament material used for producing the composite filament depicted in FIG. 6B. FIG. 5 is a perspective view for explaining a method of producing the precursor depicted in FIG. 1. FIGS. 3 and 8B are sectional views of $Nb_3Sn$ compound superconducting wires (hereinafter referred to as "compound superconducting wire") obtained by heating the precursors depicted in FIGS. 1 and 8A, respectively.

Figure 1:
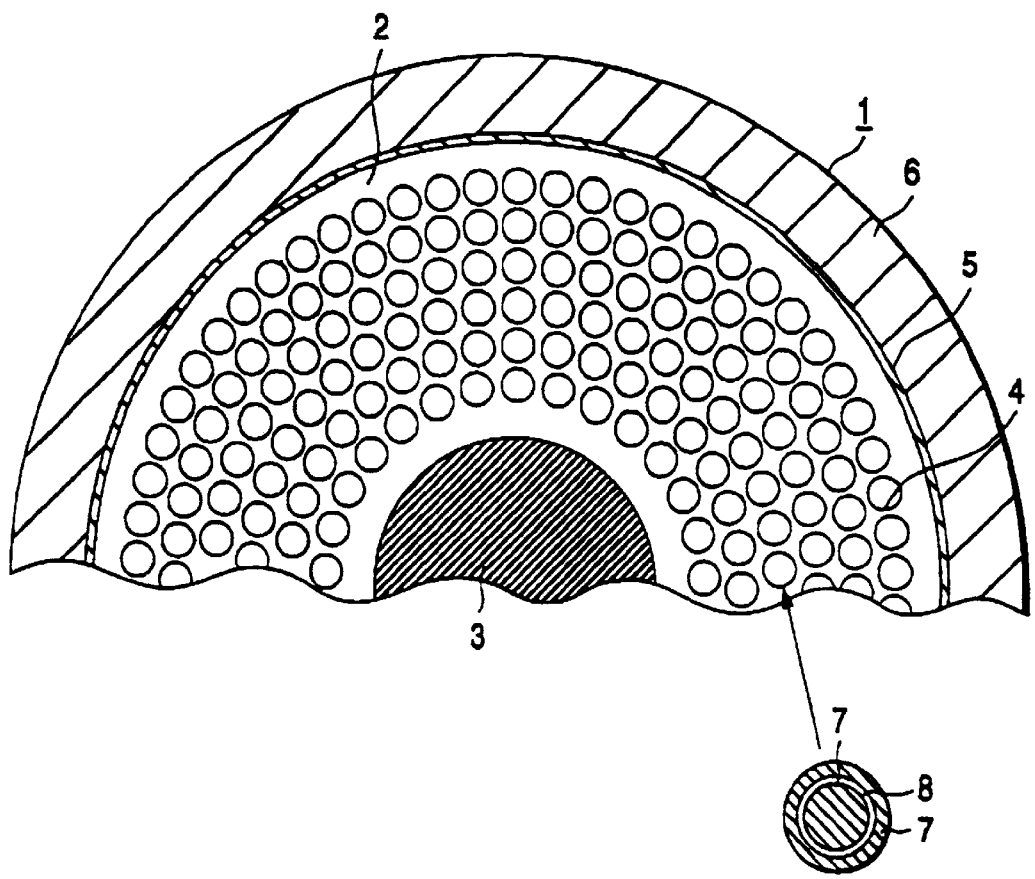
FIG. 1 is a cross-sectional view of an Nb—Sn compound superconducting wire precursor according to an embodiment of the present invention.
Figure 8A:
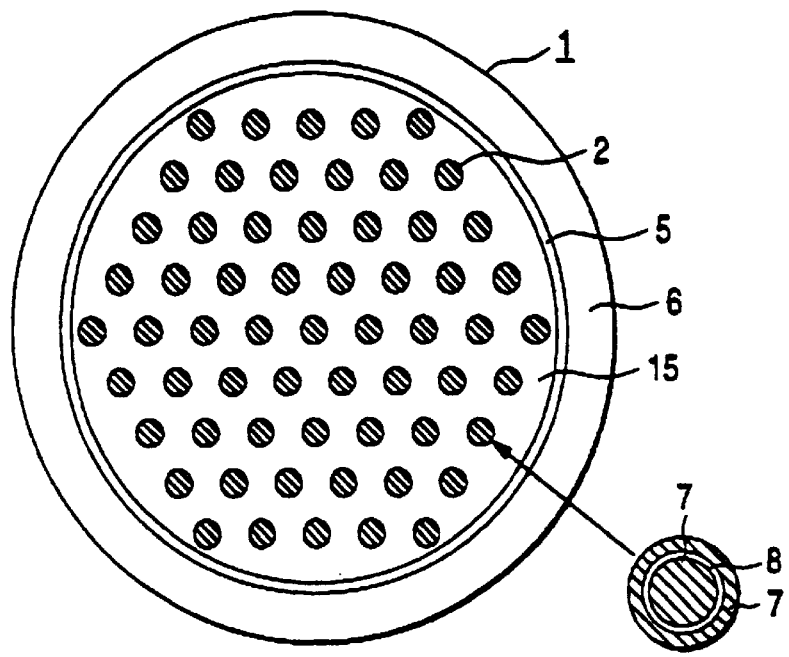
FIGS. 8A and 8B are cross-sectional views of an Nb—Sn compound superconducting wire and a precursor therefor according to a further embodiment of the present invention.
Figure 8B:
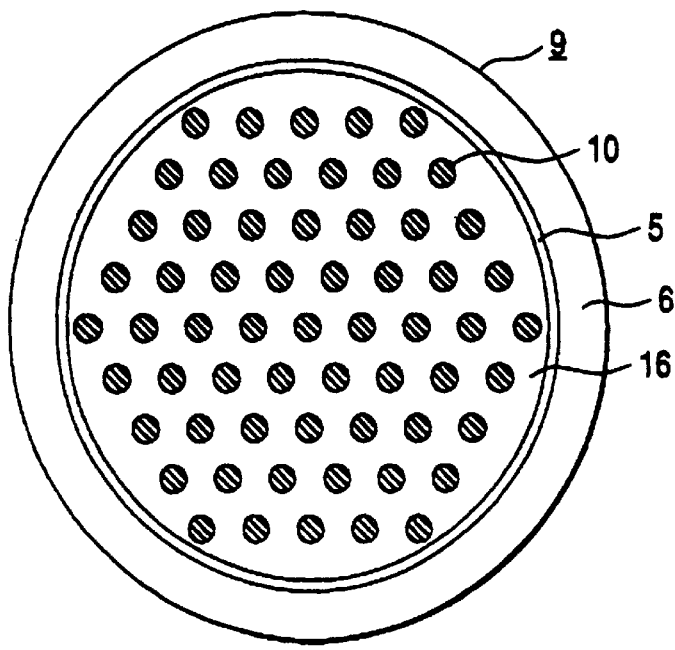
Figure 9:
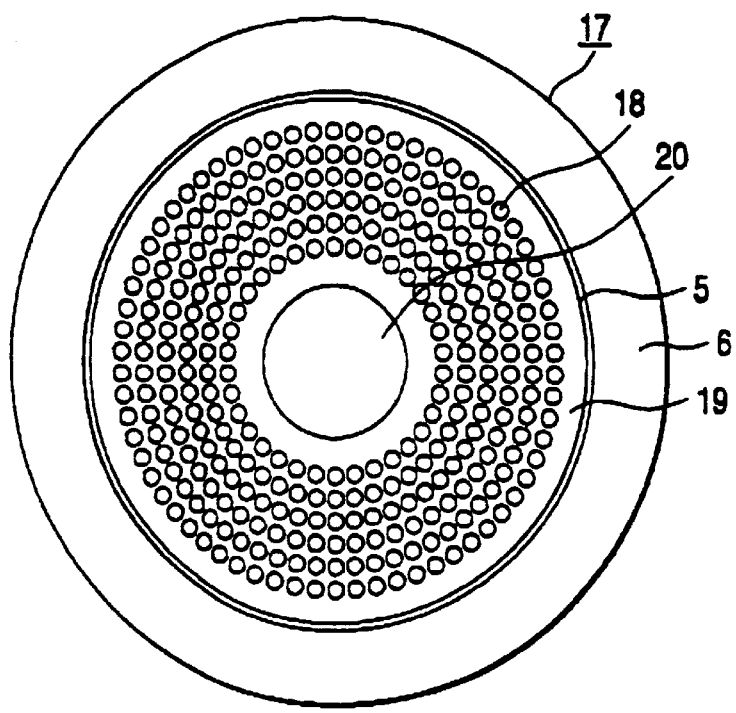
FIG. 9 is a cross-sectional view of a conventional Nb—Sn compound superconducting wire precursor.
Figure 10:
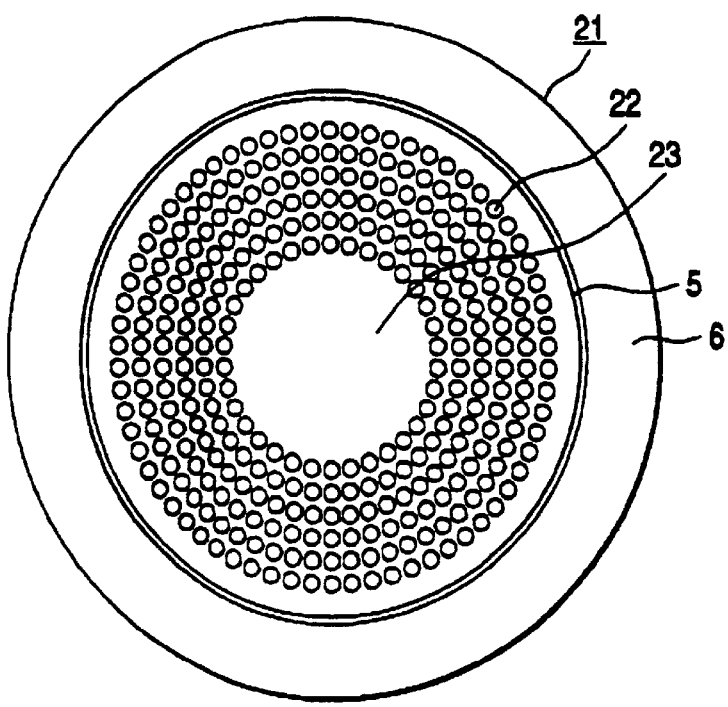
FIG. 10 is a cross-sectional view of a conventional Nb—Sn compound superconducting wire.

In FIGS. 1, 6A, 6B and 8A, the precursor 1 has a structure in which a plurality of composite filaments 2 are embedded in a matrix 4, 15 of a Cu-base metal so as not to be in contact with one another. Each of the composite filaments 2 is composed of a niobium layer 7 of an Nb-base metal, and a titanium layer 8 of pure Ti enveloped in the niobium layer 7. In FIGS. 1, 6A and 6B, the precursor 1 contains a tin-base core 3 of an Sn-base metal as Sn to be combined with the niobium layer 7 to form a compound in the matrix 4, 15 diffused by heat treatment. In FIG. 8A, the precursor 1 contains Sn of Cu—Sn bronze as such Sn in the matrix 15.

Each of the composite filaments 2 may be configured variously in such a manner that the titanium layer 8 of pure Ti is enveloped in the niobium layer 7 of an Nb-base metal so that the titanium layer 8 is not in contact with the matrix 4. For example, in an internal tin diffusion method shown in FIG. 1, the composite filament 2 has a fibrous niobium layer 7, and a titanium layer 8 enveloped in the fibrous niobium layer 7. In a jelly roll method shown in FIG. 6B, the composite filament 2 is configured so that a titanium layer 8 of pure Ti is enveloped in a niobium layer 7 and then the whole is rolled up.

In the precursor 1 according to the present invention, preferably, the ratio of the titanium layer 8 in the composite filament 2 is made to be in a range of from 0.01 to 5.0% by weight.

As described above, not only the composite filament 2 is composed of a niobium layer 7 of an Nb-base metal and a titanium layer 8 of pure Ti but also the composite filament 2 is formed so that the titanium layer 8 of pure Ti is enveloped in the niobium layer 7 of an Nb-base metal. Accordingly, difficult production of a Ti-added alloy becomes unnecessary, so that it is possible to eliminate unevenness caused by generation of an intermetallic compound, breaking during wire-drawing, involvement of oxygen impurities such as a titanium oxide, or the like, concentration gradient of titanium between the inner and outer arrays of superconducting filaments at the time of heat treatment of the precursor 1 in the internal tin diffusion method, etc. Thus, it is possible to obtain a compound superconducting wire in which the precursor 1 can be produced easily and inexpensively, with stable quality, and in which the superconducting properties Jc and n-value are improved by heat treatment.

In the precursor 1 according to the present invention, the composite filament 2 is composed of a niobium layer 7 of an Nb-base metal, and a titanium layer 8 of pure Ti. Accordingly, Ta, Hf, Mo, Zr, V or W can be easily added to the niobium layer 7 not containing Ti hiqh in vapor pressure. Furthermore, by addition of 0.01 to 5% by weight of Ta, Hf, Mo, Zr, V or W to the niobium layer 7 in the composite filament 2, the superconducting property obtained by the heat treatment thereafter can be improved so that the upper critical magnetic field in the compound superconducting wire can be improved.

In the precursor 1 according to the present invention, as shown in the precursor by the internal tin diffusion method in FIG. 1 or as shown in the precursor by the jelly roll method in FIGS. 6A and 6B, the matrix 4 is provided as pure copper and tin-base cores 3 of an Sn-base metal material embedded in the matrix 4 so as not to be in contact with the composite filaments 2 are arranged in the matrix 4. In FIGS. 6A and 6B, because each of the tin-base cores 3 is enclosed by the roll-like composite filament 2, the Sn diffusion barrier 5 as shown in FIG. 1 is not required.

In the precursor 1 according to the present invention, in FIGS. 1, 6A and 6B, each of the composite filaments 2 is composed of a niobium layer 7 of an Nb-base metal, and a titanium layer 8 of pure Ti. Accordingly, even in the case where In, Ga, Bi, Mg, Al, Ge or Si is added to the tin-base core 3, there is no Ti intermetallic compound generated. Accordingly, processing property in the process of production of the precursor 1 is not spoiled. Furthermore, when 0.01 to 10% by weight of one element or more selected from the group consisting of In, Ga, Bi, Mg, Al, Ge and Si are added to the tin-base core 3, Jc of the compound superconducting wire obtained by the heat treatment thereafter can be improved.

The matrix 4 in the precursor 1 shown in FIGS. 1, 6A and 6B is constituted by pure copper as described above. In the precursor 1 by the bronze method shown in FIG. 8A, however, the matrix 15 is composed of Cu—Sn bronze so that Sn in the matrix 15 of Cu—Sn bronze is diffused at the time of heat treatment so as to be combined with the niobium layer 7 to form a compound.

In FIGS. 1, 6A, 6B and 8A, in the precursor 1 according to the present invention, each of the composite filaments 2 is composed of a niobium layer 7 of an Nb-base metal, and a titanium layer 8 of pure Ti. Accordingly, even in the case where Mn, Ge, Si, Ni, Sn, Ga or Zn is added to the matrix 4 of pure copper or Cu—Sn bronze, there is no Ti intermetallic compound generated. Accordingly, the processing property in the process of production of the precursor 1 is not spoiled. Furthermore, when 0.01 to 5% by weight of one element or more selected from the group consisting of Mn, Ge, Si, Ni, Sn, Ga and Zn are added to the matrix 4, 15, not only an effect of reduction of AC loss, improvement of Jc or Kirkendall void suppression effect is obtained but also the proximity effect of superconducting filaments due to so-called effusion of the composite filaments 2 in the heat treatment of the precursor 1 by the internal tin diffusion method shown in FIG. 1 can be suppressed. By the suppression of the proximity effect, the hysteresis loss in a fluctuating magnetic field can be lightened greatly.

The method for producing the precursor 1 will be described below.

First, as shown in FIG. 2, a titanium material 8a of pure Ti is wound around the outer circumference of a rod-like niobium material 7a of an Nb-base metal. Further, a thin-plate-like niobium material 7b of an Nb-base metal is wound around the outer circumference of the titanium material 8a. Then, the whole is subjected to wire-drawing to thereby obtain a composite filament material 2a having a structure in which the titanium material 8a is enclosed by the niobium materials 7a and 7b (step (a)).

The composite filament material 2a in the step (a) may be configured such that a titanium material 8b of pure Ti is embedded in a rod-like or pipe-like niobium material 7a of an Nb-base metal and then the whole is subjected to wire-drawing as shown in FIG. 4. Alternatively, the composite filament material 2a in the step (a) may be configured such that a composite filament material 2a in which a titanium material 8c of pure Ti is interposed between plate-like niobium materials 7c of an Nb-base metal is put on a matrix material 4c of a copper thin plate and the whole is rolled up around a tin core material 3a clad in a matrix material 4b of copper. Then, the whole is subjected to wire-drawing as shown in FIG. 7. That is, the composite filament material 2a may be configured suitably such that the titanium material 8a, 8b or 8c of pure Ti is enveloped in the niobium material 7a, 7b or 7c of an Nb-base metal as described above.

As shown in FIG. 5, a plurality of composite filament materials 2a are then arranged in the matrix material 4a of a Cu-base metal having holes and disposed in a billet 13 such that the composite filament materials 2a are not in contact with one another. After vacuum sealing and pressing, a hole is formed in the center portion of the matrix material 4a. A tin-base core material 3a of an Sn-base metal is inserted into the hole to thereby produce a composite rod 12 (step (b)). Instead of use of the matrix material 4a, composite filament materials 2a each coated with a copper pipe may be densely arranged in the billet. At the time of heat treatment, Sn in the tin-base core material 3a is combined with the niobium material 7a in the composite filament 2a to thereby generate a compound.

Incidentally, in order to produce the precursor by the jelly roll method shown in FIGS. 6A and 6B, a large number of composite filament materials 2a (each coated with a copper pipe 14) shown in FIG. 7 are bundled and installed in the billet of Cu. Then, the whole is subjected to vacuum sealing, cold hydrostatic pressure extrusion and wire-drawing to thereby produce the precursor. The tin-base core material 3a enclosed by the composite filament material 2a is diffused at the time of heat treatment, so that the tin-base core material 3a is combined with the niobium material 7c to generate a compound. The copper pipe 14 serves as a matrix and also as a stabilizing material.

Further, in the production of the precursor by the bronze method shown in FIG. 8A, Cu—Sn bronze is used as the matrix material. Sn in the matrix material of Cu—Sn bronze is diffused so as to be combined with the niobium material to thereby generate a compound.

Then, the composite rod 12 is subjected to wire-drawing (step (c)) to thereby produce the precursor 1 shown in FIG. 1 or 6A.

Preferably, the ratio of the titanium material 8 to the composite filament material 2a shown in FIGS. 2, 4 and 7 is made to be in a range of from 0.01 to 5% by weight.

As described above, in the step (a), not only the composite filament material 2a is composed of a niobium material 7a, 7b or 7c of an Nb-base metal, and a titanium material 8a, 8b or 8c of pure Ti but also the composite filament material 2a is formed so that the titanium material 8a, 8b or 8c of pure Ti is enclosed by the niobium material 7a, 7b or 7c of an Nb-base metal. Accordingly, difficult production of a Ti-added alloy is not required. As a result, it is possible to eliminate unevenness caused by generation of an intermetallic compound, breaking during wire-drawing, involvement of oxygen impurities such as titanium oxide, or the like, concentration gradient of titanium between the inner and outer arrays of the superconducting filaments at the time of heat treatment of the precursor in the internal tin diffusion method, etc. Accordingly, it is possible to obtain a compound superconducting wire in which the precursor stable in quality can be produced easily at low cost and in which the superconducting properties Jc and n-value can be improved by heat treatment.

In the step (a), the composite filament material 2a is composed of a niobium material 7a, 7b or 7c of an Nb-base metal, and a titanium material 8a, 8b or 8c of pure Ti. Accordingly, Ta, Hf, Mo, Zr, V or W can be easily added to the niobium material 7a, 7b or 7c not containing Ti high in vapor pressure. Furthermore, by addition of 0.01 to 5% by weight of Ta, Hf, Mo, Zr, V or W to the niobium material 7a, 7b or 7c in the composite filament material 2a, the superconducting property obtained by heat treatment thereafter can be improved so that the upper critical magnetic field in the $Nb_3Sn$ compound superconducting wire can be improved.

In the step (b), in FIG. 5, a hole is formed in the center portion of the matrix material 4a of pure copper so that a tin-base core material of an Sn-base metal is embedded in this center portion so as not to be in contact with the composite filament materials 2a. If a composite filament material 2a composed of clad materials consisting of a matrix material 4c of pure copper, a niobium material 7c and a titanium material 8c is wound around a tin-base core material 3a clad with a matrix material 4b of pure copper so that the tin-base core material 3a is enclosed by the Nb-containing composite filament material 2a as shown in FIG. 6B, a precursor which does not require any Sn diffusion barrier 5 (FIG. 1) is obtained.

In the step (a), in FIGS. 2, 4 and 6B, each of the composite filament materials 2a is composed of an Nb-base metal and pure Ti. Accordingly, even in the case where In, Ga, Bi, Mg, Al, Ge or Si is added to the tin-base core material 3a, no Ti intermetallic compound is generated. Accordingly, processing property in the process of production of the precursor 1 is not spoiled. Furthermore, when 0.01 to 10% by weight of one element or more selected from the group consisting of In, Ga, Bi, Mg, Al, Ge and Si are added to the tin-base core 3, Jc of the compound superconducting wire obtained by heat treatment thereafter can be improved.

In the step (b), the matrix material 4a may be composed of pure copper or Cu—Sn bronze.

Even in the case where Mn, Ge, Si, Ni, Sn, Ga or Zn is added to the matrix materials 4a, 4b or 4c of pure copper or Cu—Sn bronze, no Ti intermetallic compound is generated. Accordingly, processing property in the process of production of the precursor 1 is not spoiled. Furthermore, when 0.01 to 5% by weight of one element or more selected from the group consisting of Mn, Ge, Si, Ni, Sn, Ga and Zn are added to the matrix materials 4a, 4b or 4c, not only an effect of reduction of AC loss, improvement of Jc or Kirkendall void suppression effect can be obtained but also the proximity effect of superconducting filaments due to so-called effusion in the heat treatment of the precursor 1 by the internal tin diffusion method shown in FIG. 1 can be suppressed. By the suppression of the proximity effect, the hysteresis loss in a fluctuating magnetic field can be lightened greatly.

In FIGS. 1, 6A, 6B and 8A, by the heat treatment of the aforementioned precursor 1, such a compound superconducting wire having superconducting property as described above with respect to the precursor 1 is obtained.

EMBODIMENT 1

Now, Embodiment 1 of the present invention will be described below specifically.

FIG. 1 is a cross-sectional view showing a compound superconducting wire precursor according to an embodiment of the present invention. FIG. 2 is a cross-sectional view showing a composite filament material used for producing the composite filaments shown in FIG. 1. FIG. 3 is a sectional view showing a compound superconducting wire obtained by heat-treating the compound superconducting wire precursor shown in FIG. 1.

In FIG. 1, the reference numeral 1 designates a compound superconducting wire precursor, and 2 designates composite filaments. Each of the composite filaments 2 is formed such that a titanium layer 8 of Ti is enveloped in a fibrous niobium layer 7 of an Nb-base metal. The reference numeral 3 designates a tin-base core of an Sn-base metal arranged in the center of the array of composite filaments 2, and 4 designates a matrix in which the tin-base core 3 and the array of composite filaments 2 in the outside of the tin-base core 3 are embedded so as not to be in contact with one another. Pure copper is used as the matrix 4. The reference numeral 5 designates a barrier material for covering the outer circumference of the matrix 4, and 6 designates a stabilizing material for covering the outer circumference of the barrier material 5. Nb or Ta (tantalum) is used for the barrier material 5. Pure copper is used for the stabilizing material 6.

In FIG. 3, the reference numeral 9 designates a compound superconducting wire obtained by heat-treating the precursor 1 shown in FIG. 1 at a temperature of 600° C. to 800° C. for 100 to 200 hours; 10, superconducting filaments of Ti-added Nb$_3$Sn; 11, a matrix of low Sn concentration bronze in which the superconducting filaments 10 are embedded so as not to be in contact with one another; 5, a barrier material; and 6, a stabilizing material.

Now, the method for producing the precursor shown in FIG. 1 will be described below.

First, a titanium thin plate having a thickness of 0.1 mm is cut into a size of 120 mm×1000 mm and wound by about 1.6 turns around a round rod of an Nb-base metal having a diameter of 23.5 mm and a length of 1000 mm. A thick plate of an Nb-base metal having a thickness of 2 mm and cut into a size of 100 mm×1000 mm is wound around the outside of the wound titanium thin plate. Then, the rod with the thin and thick plates wound thereon is inserted in a pipe of pure copper having an inner diameter of 31 mm and an outer diameter of 35 mm to thereby form a composite single-core wire. The composite single-core wire is drawn to produce a composite filament material 2a (coated with copper) in which a titanium material 8a is enclosed by niobium materials 7a and 7b as shown in FIG. 2. The thick plate of an Nb-base metal having a thickness of 2 mm may be replaced by a pipe of an Nb-base metal.

810 pieces of the thus prepared copper-coated composite filament materials 2a are packed around a copper rod disposed in the center of a pure copper billet having an outer diameter of 180 mm and an inner diameter of 160 mm. After the composite filament materials 2a are vacuum-sealed in the billet, a composite rod composed of 810 composite filament materials 2a is produced by hot isostatic press (HIP). A hole is formed in the center portion of the composite rod and pure tin is inserted in this hole.

The composite rod is then drawn to produce a composite wire. The composite wire is inserted into a pipe of Nb which will be a tin diffusion barrier material. Further, the outside of the Nb pipe is covered with a copper pipe as a stabilizing material to thereby produce the precursor 1 shown in FIG. 1.

By heat-treating the precursor 1 produced in a manner as described above, Ti in the titanium layer 8 is diffused into the niobium layer 7 in each of the composite filaments 2 and Sn in the tin-base core 3 is diffused into the ambient matrix 4. Accordingly, the matrix 4 changes into low Sn concentration bronze, and Sn reacts with the composite filament 2 so that Nb$_3$Sn is generated on the surface of or in the whole of the niobium layer 7. Thus, a compound superconducting wire 9 containing superconducting filaments 10 (see FIG. 3) of Nb$_3$Sn to which Ti is added evenly, is produced.

Jc of the compound superconducting wire 9 obtained in such a manner as described above was measured in liquid helium. As a result, the value of Jc was 1000 A/mm$^2$ which was higher by about 15–30% than the conventional value, in the magnetic field of B=12 T. Further, the n-value was 32 which was 1.28 to 1.45 times as large as the conventional n-value. Thus, significant improvement of characteristic was confirmed.

As described above, in the precursor shown in FIG. 1, each of the composite filaments 2 is composed of a niobium layer 7 of an Nb-base metal and a titanium layer 8 of pure Ti enveloped in the niobium layer 7. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like, concentration gradient of titanium between the inner and outer arrays of filaments at the time of heat-treatment of the precursor, etc. Thus, it is possible to produce an Nb$_3$Sn compound superconducting wire in which the precursor 1 can be produced easily at low cost with stable quality, and the superconducting properties Jc and n-value can be improved.

EMBODIMENT 2

FIG. 4 is an enlarged sectional view showing a composite filament material 2a according to Embodiment 2 of the present invention. FIG. 5 is a perspective view for explaining another method of producing a precursor. A cross-section of a compound superconducting wire obtained from the precursor in this Embodiment 2 has substantially the same structure as that in FIG. 1.

In FIG. 4, the reference numeral 2a designates a composite filament material; 7a, a rod-like niobium material of an Nb-base metal; and 8b, a titanium material of pure Ti embedded in a hole mechanically formed in the niobium material 7a.

In FIG. 5, the reference numeral 12 designates a composite rod; 4a, a matrix material of pure copper in which a large number of holes are formed; and 13, a billet of pure copper.

The method for producing the precursor in this Embodiment 2 will be described below.

First, a hole with a diameter of 4.1 mm was bored in the center of an Nb round rod having a diameter of 30 mm and a length of 100 mm. A pure titanium round rod having a diameter of 4 mm and a length of 100 mm was inserted into the hole and subjected to swazing-treatment. Thus, a composite filament material 2a (FIG. 4), in which a titanium material 8a was embedded in a niobium material 7a having a diameter of 4.6 mm, was produced.

Although this Embodiment 2 has shown the case where an Nb round rod is used for reduction in cost, the present invention may be applied also to the case where an Nb pipe is used if it is difficult to bore a hole through a long Nb round rod. Further, the outside of the Nb round rod may be covered with a copper pipe so that the Nb round rod can be subjected to wire-drawing easily, instead of swazing-treatment.

Then, as shown in FIG. 5, a plurality of matrix materials 4a each formed of a copper disk having 309 holes were installed in a billet 13, and 309 composite filament materials 2a produced in the same manner as described above were inserted into the holes of the matrix materials 4a respectively. Further, vacuum sealing was made to thereby produce a composite rod 12. Each of the matrix materials 4a was formed of pure copper having a diameter of 160 mm and a thickness of 10 mm. Each of the holes had a diameter of 4.7 mm and was formed by an NC driller. The billet 13 was formed of pure copper having an outer diameter of 180 mm and an inner diameter of 160 mm. 30 matrix materials 4a were inserted into the billet 13 so that the positions of the holes were aligned.

After the composite rod 12 was then subjected to extrusion by hot isostatic press (HIP), a hole was formed in the center of the composite rod 12. A tin-base core material of pure Sn was inserted into the hole to thereby produce a composite rod 12. Then, the composite rod 12 was subjected to wire-drawing to thereby produce a composite wire. After the composite wire was inserted into a Ta pipe as a barrier material and the outside of the barrier material was covered with a copper pipe as a stabilizing material, wire-drawing was carried out to thereby produce the same precursor as the precursor 1 shown in FIG. 1.

The precursor 1 produced as described above had a structure in which: a tin-base core 3 located in the center of a matrix 4 and 309 composite filaments 2 arranged in the outside of the tin-base core 3 and each containing a titanium material 8 enveloped in the center portion of a niobium layer 7 were embedded in the matrix 4 so as not to be in contact with each other; and the outer circumference of the matrix 4 was coated with a barrier material 5 and a stabilizing material 6 successively.

By heat-treating the precursor 1 in this Embodiment 2 at a temperature of 600° C. to 800° C. for 50 to 200 hours, not only Ti in the titanium material 8 was diffused into the niobium material 7 in each of the composite filaments 2 but also Sn in the tin-base core 3 was diffused into the ambient matrix 4. As a result, the matrix 4 changed into low Sn concentration bronze and Sn reacted with the composite filaments 2 to thereby generate $Nb_3Sn$ in the surface of or in the whole of the niobium layer 7. Thus, a compound superconducting wire 9 was produced so that superconducting filaments 10 (see FIG. 3) of $Nb_3Sn$ into which Ti was added evenly was produced.

Jc of the compound superconducting wire 9 of this Embodiment 2 obtained as described above was measured in liquid helium. As a result, in the magnetic field of B=12 T, the value of Jc was 1000 A/mm$^2$ which was higher by about 15–30% than the conventional value. Significant improvement of superconducting property was thus confirmed.

As described above, in the precursor 1 in this embodiment, each of the composite filaments 2 is composed of a niobium layer 7 of an Nb-base metal and a titanium layer 8 of pure Ti enveloped in the niobium layer 7. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like, concentration gradient of titanium between the inner and outer arrays of superconducting filaments at the time of heat-treatment of the precursor, etc. Thus, it is possible to produce an $Nb_3Sn$ compound superconducting wire in which the precursor and the compound superconducting wire can be produced easily at low cost with stable quality, and the superconducting properties Jc and n-value can be improved.

EMBODIMENT 3

FIGS. 6A and 6B show a precursor as Embodiment 3 of the present invention. FIG. 6A is a cross-sectional view of the precursor. FIG. 6B is an enlarged sectional view showing the configuration of a composite filament 2 used in the precursor depicted in FIG. 6A. FIG. 7 is an enlarged perspective view of a composite filament material used for producing the precursor depicted in FIG. 6A.

In FIGS. 6A and 6B, the reference numeral 1 designates a precursor; 2, a composite filament; 3, a tin-base core of pure tin; 4, a matrix of pure copper; and 6, a stabilizing material of pure copper acting also as a matrix.

In FIG. 7, the reference numeral 7c designates a niobium material; and 8c, a titanium material clad in the niobium material 7c. The reference numeral 4b designates a matrix material formed of pure copper and clad with a tin-base core material 3a; 4c, a thin-plate-like matrix material formed of pure copper; and 14, a copper pipe formed of pure copper.

The method for producing the precursor in this embodiment is so called "jelly roll method". The precursor was produced as follows.

First, a thin Ti plate having a width of 150 mm, a length of 1000 mm and a thickness of 0.1 mm was sandwiched between 2.5 mm-thick Nb plates of the same size and rolled to produce a lamination having a titanium material 8c clad in a niobium material 7c. Notches of about 5 mm were formed in the surface of the lamination at random in the longitudinal direction of lamination.

A matrix material 4c formed of a 0.2 mm-thick pure copper thin plate having the same size as the lamination was put on the lamination, and the lamination and the matrix 4c were wound by 11 turns around a 10 mm-diameter clad material which was composed of a tin-base core material 3a clad in a pure copper matrix material 4b to thereby produce the composite filament material 2a. The thus formed composite filament material was inserted into a copper pipe 14 having an inner diameter of 20 mm and an outer diameter of 23 mm to thereby produce a composite filament material 2a coated with a copper pipe 14 as shown in FIG. 7.

The composite filament material 2a produced in such a manner as described above was drawn to form a hexagonal single-core wire having each side with a length of 3.2 mm. 91 single-core wires were densely installed in a copper billet and vacuum-sealed. Then, cold hydrostatic extruding, wire-drawing and twisting were carried out successively to thereby produce a precursor 1 having a diameter of 0.5 mm as a final diameter as shown in FIG. 6A.

By heat-treating at a temperature of 600° C. to 800° C. for 50 to 200 hours, the precursor obtained as described above changed into a compound superconducting wire.

By heat-treating the precursor 1 in this Embodiment 3, Ti in the titanium layer 8 and Sn in the tin-base core 3 for constituting each of the composite filaments 2 are diffused into the matrix 4. As a result, not only both the tin-base core 3 and the matrix 4 change into low Sn concentration bronze but also Ti and Sn react with Nb in the niobium layer 7. Thus, $Nb_3Sn$ in which Ti is added evenly is generated in the composite filament 2.

Jc of the compound superconducting wire of this Embodiment 3 obtained in such a manner as described above was measured in liquid helium. As a result, the value of Jc was 1100 A/mm$^2$ which was higher by about 15% than the value in the conventional jelly roll method, in the magnetic field of B=12 T. Significant improvement of characteristic was confirmed.

As described above, in the precursor 1 in this Embodiment 3, each of the composite filament materials 2 is composed of a niobium layer 7 of an Nb-base metal and a titanium layer 8 of pure Ti enveloped in the niobium layer 7 as shown in FIG. 6B. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like. Thus, it is possible to produce an Nb$_3$Sn compound superconducting wire in which the precursor 1 and the compound superconducting wire can be produced easily at low cost with stable quality, and the superconducting properties Jc and n-value can be improved.

In addition, in the precursor in this Embodiment 3, no barrier material is required because a tin-base core 3 is arranged in the center portion of each of the composite filaments 2 so as to be covered with a niobium layer 7.

EMBODIMENT 4

FIGS. 8A and 8B are cross-sectional views showing a compound superconducting wire precursor according to Embodiment 4 of the present invention and a compound superconducting wire respectively. The compound superconducting wire shown in FIG. 8B is obtained by heat-treating the precursor shown in FIG. 8A.

In FIG. 8A, the reference numeral 1 designates a compound superconducting wire precursor; and 2, composite filaments each composed of a niobium layer 7 and a titanium layer 8 and having the same structure as in Embodiment 1. The reference numeral 15 designates a matrix in which the composite filaments 2 are embedded so as not to come in contact with one another. The matrix 15 is formed of a Cu—Sn bronze alloy. The reference numeral 5 designates a barrier material for covering the outer circumference of the matrix material 15; and 6, a stabilizing material for covering the outer circumference of the barrier material 5. The barrier material 5 is formed of Nb or Ta. The stabilizing material 6 is formed of pure copper.

In FIG. 8B, the reference numeral 9 designates a compound superconducting wire obtained by heating the precursor 1 shown in FIG. 8A at a temperature of 600° C. to 800° C. for a period of 100 to 200 hours; 10, superconducting filaments each formed of Ti-added Nb$_3$Sn; 16, a matrix formed of low Sn concentration bronze in which the respective superconducting filaments 10 are embedded so as not to be in contact with one another; 5, a barrier material; and 6, a stabilizing material.

This embodiment is so called "bronze method". The composite filaments 2 are produced in the same manner as in Embodiment 1. First, the same Ti thin plate as in Embodiment 1 and the same Nb thick plate as in Embodiment 1 were wound as a roll around an Nb round rod. Then, the whole of the rod was inserted into a Cu—Sn bronze alloy pipe having an inner diameter of 31 mm and an outer diameter of 35 mm, and then drawn to thereby produce a 4.2 mm-diagonal hexagonal wire in which a composite filament material composed of a niobium material and a titanium material was coated with Cu—Sn bronze. The 2 mm-thick Nb plate may be replaced by an Nb pipe.

810 hexagonal wires produced in the same manner as described above and each composed of a composite filament material and Cu—Sn bronze were packed in a billet of a Cu—13% Sn bronze alloy having an outer diameter of 180 mm and an inner diameter of 160 mm and vacuum-sealed in the billet. Then, the hexagonal wires were pressed by hot isostatic press (HIP) to thereby produce a composite rod having 810 hexagonal wires.

The composite rod composed of 810 hexagonal wires was drawn to produce a composite wire in which 810 hexagonal wires were arranged. The composite wire was inserted into a niobium pipe acting as a tin diffusion barrier material. Further, the outside of the niobium pipe was covered with a copper pipe acting as a stabilizing material to thereby produce the precursor 1 shown in FIG. 8A.

By heat-treating the precursor 1 produced as described above, not only Ti in the titanium layer 8 was diffused into the niobium layer 7 in each of the composite filaments 2 but also Sn in the matrix 15 was diffused. As a result, the matrix 15 changed into low Sn concentration bronze and Ti and Sn reacted with the composite filaments 2. Accordingly, Nb$_3$Sn in which Ti was added evenly was generated in the surface of or in the whole of the niobium layer 7 to thereby produce a compound superconducting wire 9 as shown in FIG. 8B.

Jc of the compound superconducting wire 9 obtained in such a manner as described above was measured in liquid helium. As a result, the value of Jc was 850 A/mm$^2$ which was higher by about 10% than the conventional value, in the magnetic field of B=12 T. Significant improvement of characteristic was confirmed.

As described above, in the precursor shown in FIG. 8A, each of the composite filaments 2 is composed of a niobium layer 7 of an Nb-base metal and a titanium layer 8 of pure Ti enveloped in the niobium layer 7. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like. Thus, it is possible to produce a compound superconducting wire in which the precursor 1 and the compound superconducting wire 10 can be produced easily at low cost with stable quality, and the superconducting properties Jc and p-value can be improved.

EMBODIMENT 5

In the internal tin diffusion method shown in Embodiments 1 and 2, a Cu-1% Mn copper alloy is used as the matrix 4 of the precursor 1. Manganese (Mn) is added in order to suppress the proximity effect of superconducting filaments 10 caused by so-called effusion of the composite filament material 2 in the heat-treatment of the precursor 1. By the suppression of the proximity effect, the hysteresis loss in the magnetic field of ±3 T as one cycle becomes 120 mJ/cm$^3$ which is reduced to about a half compared with the case where Mn is not added.

In the case of a Cu—Mn—Ti copper alloy in which Ti is added, the alloy is hardly processed because an intermetallic compound of Mn and Ti is generated. Contrariwise in the case of a Cu—Mn copper alloy, the alloy is easily processed. Accordingly, when a matrix 4 of a Cu-1% Mn copper alloy and composite filaments 2 each composed of a niobium layer 7 and a titanium layer 8 are formed, an Mn-added precursor 1 can be produced easily without spoiling processing property such as wire-drawing characteristic, or the like, both in the composite filament 2 and the matrix 4 in the process of production of the precursor 1.

The amount of Mn to be added is effective in a range of from 0.01 to 5% by weight. Germanium (Ge), silicon (Si), nickel (Ni), tin (Sn), gallium (Ga) or zinc (Zn) can be added as another element than Mn without spoiling the processing property of the matrix 4. When 0.01 to 5% by weight of one element or more selected from the group consisting of Ge, Si, Ni, Sn, Ga and Zn are added, the proximity effect can be suppressed in the same manner as in Mn. Furthermore, an effect of reduction of AC loss is obtained by addition of Mn or Ni, an effect of improvement of Jc is obtained by addition of Ge, Si, Sn or Ga, and a Kirkendall void suppression effect is obtained by addition of Zn.

Also to the pure copper matrix 4 in the precursor 1 by the jelly roll method shown in FIGS. 6A and 6B or also to the Cu—Sn bronze matrix material 15 in the precursor 1 by the bronze method shown in FIG. 8A, 0.01 to 5% by weight of one element or more selected from the group consisting of Mn, Ge, Si, Ni, Sn, Ga and Zn can be added without spoiling processing property such as wire-drawing characteristic in the process of production of the precursor 1. When 0.01 to 5% by weight of one element or more selected from the group consisting of Mn, Ge, Si, Ni, Sn, Ga and Zn are added, an effect of reduction of AC loss, an effect of improvement of Jc, or a Kirkendall void suppression effect can be obtained in the same manner as described above.

EMBODIMENT 6

Although Jc of superconducting filaments 10 of $Nb_3Sn$ can be improved by addition of In (indium), Ga, Bi (bismuth), Mg (magnesium), Al (aluminum), Ge or Si to the superconducting filaments 10, the processing property is spoiled because an intermetallic compound is generated when these metals are added to Sn together with Ti.

In the precursor 1 shown in Embodiments 1, 2 and 3, each of the composite filaments 2 is composed of a niobium layer 7 and a titanium layer 8. Accordingly, the processing property in the process of production of the precursor 1 is not spoiled because no intermetallic compound is generated even in the case where In, Ga, Bi, Mg, Al, Ge or Si is added to the tin-base core material 3a. Furthermore, when 0.01 to 10% by weight of one element or more selected from the group consisting of In, Ga, Bi, Mg, Al, Ge and Si are added to the tin-base core material 3a, Jc of the compound superconducting wire 9 obtained by heating after that can be improved.

EMBODIMENT 7

Although the upper critical magnetic field in superconducting filaments of $Nb_3Sn$ can be improved by addition of tantalum (Ta), hafnium (Hf), molybdenum (Mo), zirconium (Zr), vanadium (V) or tungsten (W) together with Ti to the superconducting filaments, it is very difficult to add these metals together with Ti to the niobium material because the vapor pressure of Ti is high.

In the precursor 1 shown in Embodiments 1, 2 and 3, each of the composite filaments 2 is composed of a niobium layer 7 and a titanium layer 8. Accordingly, Ta, Hf, Mo, Zr, V or W can be easily added as an alloy to the niobium materials 7a, 7b and 7c in the composite filament materials 2 containing no Ti. Furthermore, when 0.01 to 5% by weight of one element or more selected from the group consisting of Ta, Hf, Mo, Zr, V and W are added to the niobium materials 7a, 7b or 7c, the superconducting property obtained by heat-treatment thereafter can be improved so that the upper critical magnetic field in the compound superconducting wire 9 can be improved.

According to the present invention, various effects can be obtained as follows.

According to an aspect of the present invention, each of composite filaments is composed of a niobium layer of an Nb-base metal and a titanium layer of pure Ti which is enveloped in the niobium layer. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like, concentration gradient of titanium between the inner and outer arrays of superconducting filaments at the time of heat-treatment of the precursor in the internal tin diffusion method, etc. There arises an effect that it is possible to obtain an Nb—Sn compound superconducting wire in which the precursor can be produced easily at low cost with stable quality, and the superconducting properties Jc and n-value can be improved by heat treatment.

According to another aspect of the present invention, each of composite filaments is composed of a niobium layer of an Nb-base metal and a titanium layer of pure Ti. Accordingly, Ta, Hf, Mo, Zr, V or W can be added easily to the niobium layer containing no Ti which is high in vapor pressure. Furthermore, when 0.01 to 5% by weight of one element or more selected from the group consisting of Ta, Hf, Mo, Zr, V and W are added to the niobium layer in each of the composite filaments, there arises an effect that the superconducting property obtained by heat-treatment thereafter can be improved and the upper critical magnetic field in the Nb—Sn compound superconducting wire can be improved.

According to a further aspect of the present invention, a tin-base core is enclosed by a composite filament containing a niobium layer shaped like a roll. Accordingly, there arises an effect that the Sn diffusion barrier is not required.

According to a further aspect of the present invention, each of composite filaments is composed of a niobium layer of an Nb-base metal and a titanium layer of pure Ti. Accordingly, even in the case where In, Ga, Bi, Mg, Al, Ge or Si is added to the tin-base core, the processing property in the process of production of the precursor is not spoiled because no Ti intermetallic compound is generated. Furthermore, when 0.01 to 10% by weight of one element or more selected from the group consisting of In, Ga, Bi, Mg, Al, Ge and Si are added to the tin-base core, Jc of the Nb—Sn compound superconducting wire obtained by heat-treatment thereafter can be improved.

According to a further aspect of the present invention, each of composite filaments is composed of a niobium layer of an Nb-base metal and a titanium layer of pure Ti. Accordingly, even in the case where Mn, Ge, Si, Ni, Sn, Ga or Zn is added to the matrix of pure copper or Cu—Sn bronze, the processing property in the process of production of the precursor is not spoiled because no Ti intermetallic compound is generated. Furthermore, when 0.01 to 5% by weight of one element or more selected from the group consisting of Mn, Ge, Si, Ni, Sn, Ga and Zn are added to the matrix, not only an effect of reduction of AC loss, improvement of Jc or a Kirkendall void suppression effect can be obtained but also the proximity effect of superconducting filaments due to so-called effusion of the composite filaments in the heat-treatment of the precursor in the internal tin diffusion method can be suppressed. There arises an effect that, by the suppression of the proximity effect, the hysteresis loss in the magnetic field of ±3 T as one cycle is lightened greatly.

According to a further aspect of the present invention, each of composite filament materials is composed of a niobium material of an Nb-base metal and a titanium material of pure Ti which is enveloped in the niobium material. Accordingly, difficult production of a Ti-added alloy becomes unnecessary. It is possible to eliminate unevenness caused by generation of an intermetallic compound, breaking during wire-drawing, involvement of oxygen impurities such as titanium oxide, or the like, concentration gradient of titanium between the inner and outer arrays of superconducting filaments at the time of heat-treatment of the precursor in the internal tin diffusion method, etc. It is possible to obtain an Nb—Sn compound superconducting wire in which the precursor can be produced easily at low cost with stable quality, and the superconducting properties Jc and n-value can be improved by heat treatment.

According to a further aspect of the present invention, each of composite filament materials is composed of a niobium material of an Nb-base metal and a titanium material of pure Ti. Accordingly, Ta, Hf, Mo, Zr, V or W can be added easily to the niobium material containing no Ti which is high in vapor pressure. Furthermore, when 0.01 to 5% by weight of one element or more selected from the group consisting of Ta, Hf, Mo, Zr, V and W are added to the niobium material in each of the composite filament materials, there arises an effect that the superconducting property obtained by heat-treatment thereafter can be improved and the upper critical magnetic field in the Nb—Sn compound superconducting wire can be improved.

According to a further aspect of the present invention, a tin-base core material is formed so as to be enclosed in a composite filament material containing Nb. Accordingly, there arises an effect that a precursor requiring no Sn diffusion barrier is obtained.

According to a further aspect of the present invention, each of composite filament materials is composed of an Nb-base metal and pure Ti. Accordingly, even in the case where In, Ga, Bi, Mg, Al, Ge or Si is added to the tin-base core, the processing property in the process of production of the precursor is not spoiled because no Ti intermetallic compound is generated. Furthermore, when 0.01 to 10% by weight of one element or more selected from the group consisting of In, Ga, Bi, Mg, Al, Ge and Si are added to the tin-base core, there arises an effect that Jc of the Nb—Sn compound superconducting wire obtained by heating after that can be improved.

According to a further aspect of the present invention, each of composite filament materials is composed of an Nb-base metal and pure Ti. Accordingly, even in the case where Mn, Ge, Si, Ni, Sn, Ga or Zn is added to the matrix material, the processing property in the process of production of the precursor is not spoiled because no Ti intermetallic compound is generated. Furthermore, when 0.01 to 5% by weight of one element or more selected from the group consisting of Mn, Ge, Si, Ni, Sn, Ga and Zn are added to the matrix material, not only an effect of reduction of AC loss, improvement of Jc or a Kirkendall void suppression effect is obtained but also the proximity effect of superconducting filaments due to so-called effusion in the heat-treatment of the precursor in the internal tin diffusion method can be suppressed. There arises an effect that, by the suppression of the proximity effect, the hysteresis loss in the fluctuating magnetic field is lightened significantly.

According to a further aspect of the present invention, it is possible to obtain an Nb—Sn compound superconducting wire having superconducting property described above with respect to the precursor of various embodiments.

What is claimed is:

1. An Nb—Sn compound superconducting wire precursor comprising:
   a metal matrix including Cu;
   a plurality of composite filaments, each composite filament comprising a layer containing niobium and a layer of pure Ti enveloped in said niobium layer; and
   Sn within said precursor and forming a compound with said niobium layer when the Nb—Sn compound superconducting wire precursor is subjected to heat treatment, diffusing said Sn through said matrix and into said composite filaments, said plurality of composite filaments being embedded in said matrix and not in contact with one another.

2. The Nb—Sn compound superconducting wire precursor according to claim 1, wherein each of said composite filaments comprises 0.01 % to 5.0 % by weight of titanium.

3. The Nb—Sn compound superconducting wire precursor according to claim 1, wherein said niobium layer contains 0.01 to 5.0% by weight of at least one element selected from the group consisting of Ta, Hf, Mo, Zr, V and W.

4. The Nb—Sn compound superconducting wire precursor according to claim 1, wherein said metal matrix comprises pure copper, and said Sn comprises an Sn-containing core embedded in said metal matrix of pure copper and not in contact with said composite filaments.

5. The Nb—Sn compound superconducting wire precursor according to claim 4, wherein each of said composite filaments has a roll shape and said Sn-containing core is enclosed by said roll-shaped composite filaments.

6. The Nb—Sn compound superconducting wire precursor according to claim 4, wherein said Sn-containing core comprises 0.01 to 10% by weight of at least one element selected from the group consisting of In, Ga, Bi, Mg, Al, Ge and Si.

7. The Nb—Sn compound superconducting wire precursor according to claim 1, wherein said metal matrix comprises Cu—Sn bronze, and said Sn is said Sn of said Cu—Sn bronze.

8. The Nb—Sn compound superconducting wire precursor according to claim 4, wherein said metal matrix contains 0.01 to 5% by weight of at least one element selected from the group consisting of Mn, Ge, Si, Ni, Sn, Ga, and Zn.

9. The Nb—Sn compound superconducting wire precursor according to claim 7, wherein said metal matrix contains 0.01 to 5% by weight of at least one element selected from the group consisting of Mn, Ge, Si, Ni, Sn, Ga, and Zn.

10. The Nb—Sn compound superconducting wire precursor according to claim 1, wherein said metal matrix includes said Sn as an alloy with Cu.

11. The Nb—Sn compound superconducting wire precursor according to claim 1, wherein said metal matrix includes said Sn as a composite with Cu.

12. The Nb—Sn compound superconducting wire precursor according to claim 1, wherein said matrix contains 0.01 to 5% by weight of at least one element selected from the group consisting of Mn, Ge, Si, Ni, Sn, Ga, and Zn.

* * * * *